US 8,213,211 B2
Jul. 3, 2012

(12) United States Patent
Kurjanowicz

(54) HIGH RELIABILITY OTP MEMORY

(75) Inventor: Wlodek Kurjanowicz, Arnprior (CA)

(73) Assignee: Sidense Corp., Ottawa, Ontario (CA)

( * ) Notice: Subject to any disclaimer, the term of this patent is extended or adjusted under 35 U.S.C. 154(b) by 266 days.

(21) Appl. No.: 12/701,140

(22) Filed: Feb. 5, 2010

(65) Prior Publication Data

US 2010/0202183 A1 Aug. 12, 2010

Related U.S. Application Data

(60) Provisional application No. 61/150,467, filed on Feb. 6, 2009.

(51) Int. Cl.
*G11C 17/16* (2006.01)

(52) U.S. Cl. ......... 365/96; 365/100; 365/104; 365/148; 365/181; 365/188; 365/94

(58) Field of Classification Search ............ 365/96, 365/100, 104, 148, 181, 188
See application file for complete search history.

(56) References Cited

U.S. PATENT DOCUMENTS

| 6,570,795 | B1 * | 5/2003 | Fricke et al. ............... 365/200 |
| 7,834,659 | B1 * | 11/2010 | Im et al. ............... 326/38 |
| 2002/0110033 | A1 | 8/2002 | Forbes |
| 2005/0254294 | A1 | 11/2005 | Iwata |
| 2006/0244099 | A1 * | 11/2006 | Kurjanowicz ............... 257/530 |
| 2007/0165441 | A1 * | 7/2007 | Kurjanowicz et al. ......... 365/96 |
| 2008/0316789 | A1 * | 12/2008 | Fredeman et al. ............... 365/96 |

FOREIGN PATENT DOCUMENTS

WO 2008077237 A1 7/2008

OTHER PUBLICATIONS

PCT Patent Application Serial No. PCT/CA2010/000137, International Search Report dated Apr. 19, 2010.

* cited by examiner

*Primary Examiner* — Hoai V Ho
*Assistant Examiner* — Jay Radke
(74) *Attorney, Agent, or Firm* — Shin Hung; Borden Ladner Gervais LLP

(57) ABSTRACT

A method and system for improving reliability of OTP memories, and in particular anti-fuse memories, by storing one bit of data in at least two OTP memory cells. Therefore each bit of data is read out by accessing the at least two OTP memory cells at the same time in a multi-cell per bit mode. By storing one bit of data in at least two OTP memory cells, defective cells or weakly programmable cells are compensated for since the additional cell or cells provide inherent redundancy. Program reliability is ensured by programming the data one bit at a time, and verifying all programmed bits in a single-ended read mode, prior to normal operation where the data is read out in the multi-cell per bit mode. Programming and verification is achieved at high speed and with minimal power consumption using a novel program/verify algorithm for anti-fuse memory. In addition to improved reliability, read margin and read speed are improved over single cell per bit memories.

33 Claims, 14 Drawing Sheets

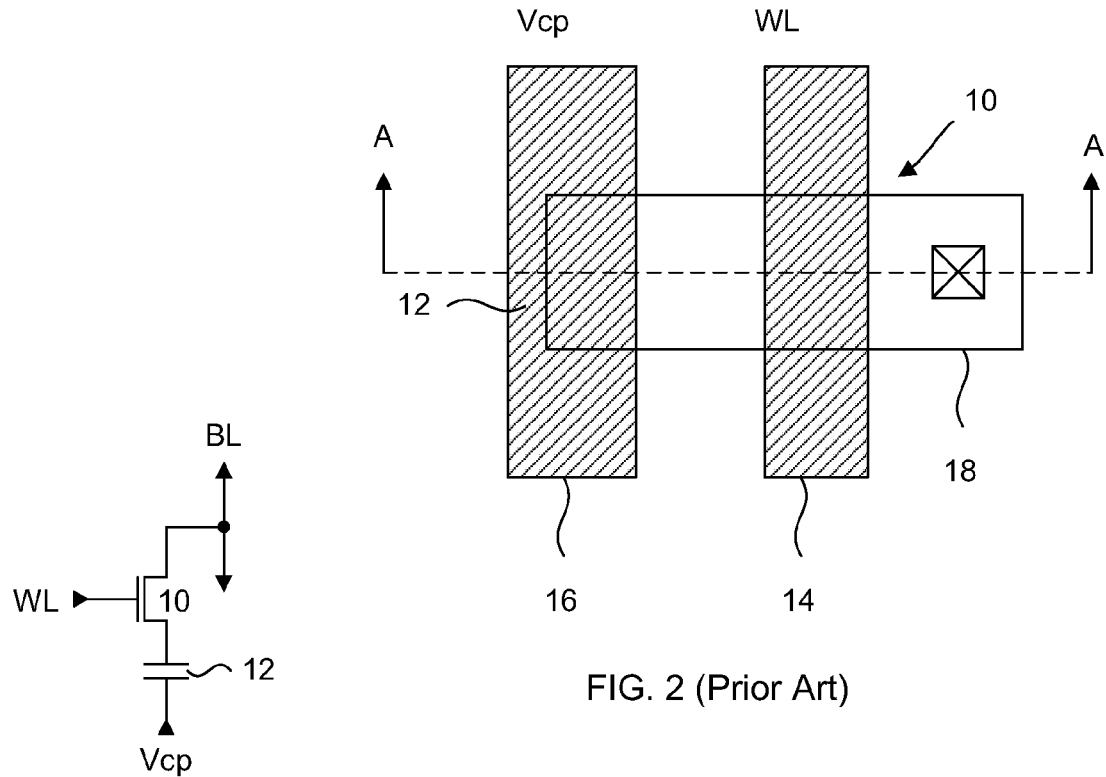
FIG. 2 (Prior Art)
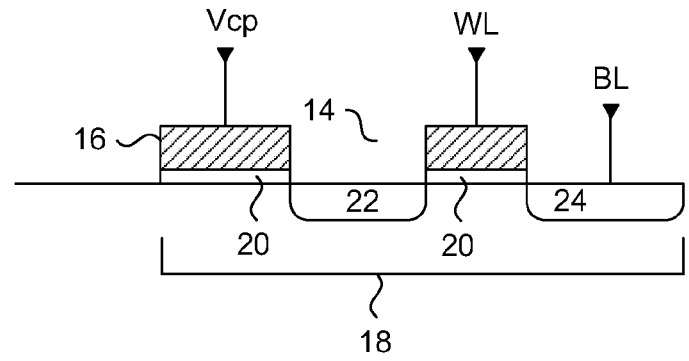
FIG. 1 (Prior Art)
FIG. 3 (Prior Art)

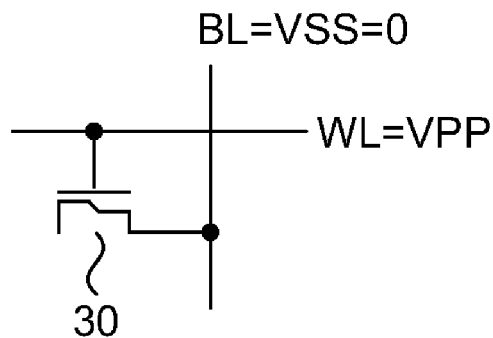
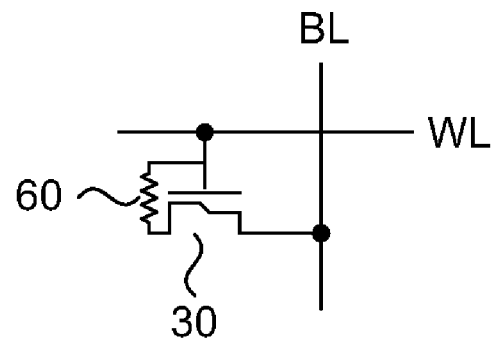
FIG. 5A  FIG. 5B
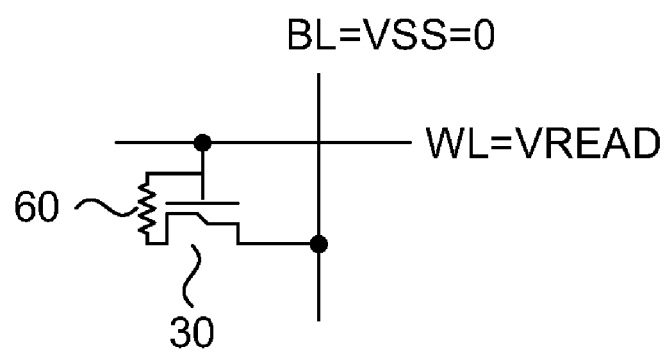
FIG. 5C

HIGH RELIABILITY OTP MEMORY

CROSS REFERENCE TO RELATED APPLICATIONS

This application claims the benefit of priority of U.S. Provisional Patent Application No. 61/150,467 filed Feb. 6, 2009, which is incorporated herein by reference in its entirety.

FIELD OF THE INVENTION

The present invention relates generally to one time programmable (OTP) memory. More particularly, the present invention relates to programming and reading one time programmable memory.

BACKGROUND OF THE INVENTION

Over the past 30 years, anti-fuse technology has attracted significant attention of many inventors, IC designers and manufacturers. An anti-fuse is a structure alterable to a conductive state, or in other words, an electronic device that changes state from not conducting to conducting. Equivalently, the binary states can be either one of high resistance and low resistance in response to electric stress, such as a programming voltage or current. There have been many attempts to develop and apply anti-fuses in the microelectronic industry, where many anti-fuse applications to date can be seen in FGPA devices manufactured by Actel and Quicklogic, and redundancy or option programming used in DRAM devices by Micron.

An anti-fuse memory is one type of one-time programmable (OTP) memory in which the device can be permanently programmed (electrically) with data once. This data is programmed by an end user for a particular application. There are several types of OTP memory cells which can be used. OTP memories provide users with a level flexibility since any data can be programmed.

FIG. 1 is a circuit diagram of a known anti-fuse memory cell, while FIGS. 2 and 3 show the planar and cross-sectional views respectively of the anti-fuse memory cell shown in FIG. 1. The anti-fuse memory cell of FIG. 1 includes a pass, or access transistor 10 for coupling a bitline BL to a bottom plate of anti-fuse device 12. Anti-fuse device 12 is considered a gate dielectric breakdown based anti-fuse device. A wordline WL is coupled to the gate of access transistor 10 to turn it on, and a cell plate voltage Vcp is coupled to the top plate of anti-fuse device 12 for programming anti-fuse device 12.

It can be seen from FIGS. 2 and 3 that the layout of access transistor 10 and anti-fuse device 12 is very straight-forward and simple. The gate 14 of access transistor 10 and the top plate 16 of anti-fuse device 12 are constructed with the same layer of polysilicon, which extend across active area 18. In the active area 18 underneath each polysilicon layer, is formed a thin gate oxide 20, also known as a gate dielectric, for electrically isolating the polysilicon from the active area underneath. On either side of gate 14 are diffusion regions 22 and 24, where diffusion region 24 is coupled to a bitline. Although not shown, those of skill in the art will understand that standard CMOS processing, such as sidewall spacer formation, lightly doped diffusions (LDD) and diffusion and gate silicidation, can be applied. While the classical single transistor and capacitor cell configuration is widely used, a transistor-only anti-fuse cell is further desirable due to the semiconductor array area savings that can be obtained for high-density applications. Such transistor-only anti-fuses should be reliable while simple to manufacture with a low cost CMOS process.

Because of its low manufacturing cost, anti-fuse memory can be utilized in all one-time programmable applications, from low cost RF-ID tag applications to automotive and security applications. RF-ID tagging applications are gaining more acceptance in the industry, particularly in sales, security, transport, logistics, and military applications for example. The simplicity and full CMOS compatibility anti-fuse memory allows for application of the RF-ID tag concept to integrated circuit manufacturing and testing processes. Therefore, IC manufacturing productivity can be increased by utilizing anti-fuse memory in combination with an RF communication interface on every wafer and/or every die on the wafer allowing for contact-less programming and reading chip specific or wafer specific information during IC manufacturing and packaging, as well as during printed circuit board assembly.

A significant advantage of OTP memory is that the end user, and not the OTP memory manufacturer, has the ability to program the data for a particular application. Therefore cost savings through economies of scale for the manufacturer are realized, while the end user can program any data to the OTP memory. This may be important for some end users, since they may be programming codes or other data that should not be released to others.

In known OTP memory such as the prior art anti-fuse memory cell of FIGS. 1 to 3, one bit of data is stored in one memory cell, and the one memory cell is accessed during a read operation to read out the bit of data stored therein. This is referred to as a single-ended read mode. Storage of the data in anti-fuse memory cells is done through programming, which as previously mentioned is typically done by the end-user. The successful programming of an anti-fuse memory cell depends on parameters such as programming voltage, temperature, and other conditions, which are ideally held at an optimum level. Unfortunately, the end user typically does not have control over such parameters. Hence there is the probability that data may not be programmed to the cells, resulting in failure to program the data. In such a situation, the OTP memory has failed and the anti-fuse memory device is discarded with a renewed attempt to program the data to a new device. In a more problematic scenario, the data may not be properly programmed to the cells because the cell is "weak" or "slow", meaning that a cell thought to have been programmed with one logic state could be read out to have the opposite logic state. This can cause malfunction of the system relying on the stored data.

Even before delivery to end users, the manufacturer of the memory may encounter defects that render the memory device useless because too many cells cannot be used. This will reduce manufacturing yield, and increase costs. Therefore, there is a need to improve the reliability of anti-fuse memories.

SUMMARY OF THE INVENTION

It is an object of the present invention to obviate or mitigate at least one disadvantage of previous anti-fuse memories.

In a first aspect, there is provided a method for programming one time programmable (OTP) memory cells. The method includes i) programming input data with first programming parameters; ii) identifying bits of the input data which failed programming with the first programming parameters as failed bits; iii) reprogramming the failed bits with second programming parameters different from the first programming parameters; and, iv) repeating the method at step ii) if at least one bit is identified as failing the reprogramming. In a present embodiment, identifying includes inhibiting bits of the input data which passed programming from further programming. In another embodiment, the first programming parameters include a first programming voltage level and a first duration of time, and programming includes driving a selected wordline with the first programming voltage level for the first duration of time. The second programming parameters can include a second programming voltage level and a second duration of time, and reprogramming can include driving the selected wordline with the second programming voltage level for the second duration of time. The first programming voltage level and the second programming voltage level can be the same, or the first programming voltage level can be less than the second programming voltage level, or the first duration of time can be less than the second duration of time.

In yet another embodiment of the first aspect, identifying includes read verifying programmed data programmed in i) by driving a selected wordline with a first read voltage, and repeating includes read verifying the reprogrammed data reprogrammed in iii) by driving the selected wordline with a second read voltage. In the present embodiment, the first read voltage is less than the second read voltage, and the second read voltage is the same or lower than a read voltage used during normal read operations. In a variation of the present embodiment, a read operation is executed after all bits of the input data have been successfully programmed by selecting at least four memory cells concurrently in a differential-redundant read mode to read one bit of data from every four OTP memory cells. Selecting can include driving at least four wordlines concurrently with a third read voltage for accessing the at least four memory cells, the third read voltage being lower than the second read voltage. Alternately, selecting includes driving at least four wordlines concurrently for accessing the at least four memory cells connected to different bitlines, and operating a sense amplifier to compare levels corresponding to combinations of the different bitlines to each other. Alternately, selecting includes driving one wordline for accessing the at least four memory cells connected to different bitlines, and operating a sense amplifier to compare levels of the different bitlines to each other. In another variation of the present embodiment, repeating further includes comparing the reprogrammed data to the input data, the at least one bit being identified as failing the reprogramming if at least one bit of reprogrammed data fails to correspond with at least one bit of the input data.

In yet another embodiment of the first aspect, a read operation is executed after all bits of the input data have been successfully programmed by selecting at least two memory cells concurrently in one of a redundant read mode and a differential read mode to read one bit of data from every two OTP memory cells. In this embodiment, selecting includes driving at least two wordlines concurrently with a third read voltage for accessing the at least two memory cells, the third read voltage being lower than the second read voltage. Alternately, selecting includes driving at least two wordlines concurrently for accessing the at least two memory cells connected to one bitline, and operating a sense amplifier to compare a bitline level corresponding to the one bitline to a reference voltage. Alternately, selecting includes driving at least two wordlines concurrently for accessing the at least two memory cells connected to different bitlines, and operating a sense amplifier to compare bitline levels corresponding to the different bitlines to each other. Alternately, selecting includes driving one wordline for accessing the at least two memory cells connected to different bitlines, coupling the different bitlines to complementary inputs of a sense amplifier, and operating the sense amplifier to compare levels of the different bitlines to each other. In a variant of the present embodiment, selecting includes coupling the different bitlines to one input of a sense amplifier, and operating the sense amplifier to compare a level corresponding to a combination of the different bitlines to a reference level, where the level and the reference level is a voltage or a current.

In a second aspect, there is provided a one time programmable memory system. The system includes a memory array, a select circuit and a mode selector. The memory array has one time programmable (OTP) cells connected to bitlines and wordlines. The select circuit is configurable to couple a variable number of OTP cells to a sense amplifier at the same time in response to an address and a selected read mode of operation. The mode selector selects the read mode of operation to control the select circuit, to access one OTP cell per bit of data in a single-ended mode during a program or verify operation, and to control the select circuit to concurrently access at least two OTP cells per bit of data for sensing during a read operation. In an embodiment of the second aspect, the system further includes control logic for configuring the mode selector to operate in the single-ended mode during the program operation, where the control logic executes a programming operation. In another embodiment, the system further includes a voltage circuit for providing a programming voltage during initial programming of the OTP cells. In this embodiment, the voltage circuit provides a first read voltage during a first read verify operation and a second read voltage during a second read verify operation.

In yet another embodiment, the select circuit includes configurable row circuits and the memory array includes a first wordline connected to a first OTP cell, a second wordline connected to a second OTP cell, a third wordline connected to a third OTP cell, a fourth wordline connected to a fourth OTP cell, a first bitline connected to the first OTP cell and the third OTP cell, a second bitline connected to the second OTP cell and the fourth OTP cell, and a sense amplifier for sensing a difference between the first bitline level and the second bitline level. The configurable row circuits can concurrently drive one pair of wordlines including the first wordline and the third wordline or the second wordline and the fourth wordline in a redundant read mode. Alternately, the configurable row circuits can concurrently drive one pair of wordlines including the first wordline and the second wordline or the third wordline and the fourth wordline in a differential read mode. In another configuration, the configurable row circuits concurrently drive the first wordline, the second wordline, the third wordline and the fourth wordline in a differential-redundant read mode.

In a further embodiment, the select circuit includes configurable column circuits and the memory array includes a first bitline connected to a first OTP cell, a second bitline connected to a second OTP cell, a third bitline connected to a third OTP cell, a fourth bitline connected to a fourth OTP cell, a first sense line selectively coupled to the first and second bitline, a second sense line selectively coupled to the third and forth bitline, and a sense amplifier for sensing a difference between the first sense line level and the second sense line level.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 1 is a circuit diagram of a DRAM-type anti-fuse cell;

FIG. 2 is a planar layout of the DRAM-type anti-fuse cell of FIG. 1;

FIG. 3 is a cross-sectional view of the DRAM-type anti-fuse cell of FIG. 2 along line A-A;

FIG. 5A is a schematic of the anti-fuse transistor of FIG. 4A under programming conditions;

FIG. 5B is a schematic of a programmed anti-fuse transistor of FIG. 4A;

FIG. 5C is a schematic of a programmed anti-fuse transistor of FIG. 4A under read conditions;

DETAILED DESCRIPTION

Generally, the present invention provides a method and system for improving reliability of OTP memories, and in particular anti-fuse memories, by storing one bit of data in at least two OTP memory cells. These are referred to as multi-cell per bit memories. Therefore each bit of data is read out by accessing the at least two OTP memory cells at the same time in a multi-cell per bit mode. By storing one bit of data in at least two OTP memory cells, defective cells or weakly programmable cells can be compensated for since the additional cell or cells provide inherent redundancy. Program reliability is ensured by programming the data one bit at a time, and verifying all programmed bits in a single-ended read mode, prior to normal operation where the data is read out in the multi-cell per bit mode. Programming and verification is achieved at high speed and with minimal power consumption using a novel program/verify algorithm for anti-fuse memory. In addition to improved reliability, read margin and read speed are improved over single cell per bit memories.

The following embodiments of the present invention will be described with reference to a single transistor anti-fuse memory cell. A description of the structure of this anti-fuse memory cell, how a bit of data is programmed, and how a bit of data is read will now be described with reference to FIGS. 4A, 4B and 4C.

Figure 4A:
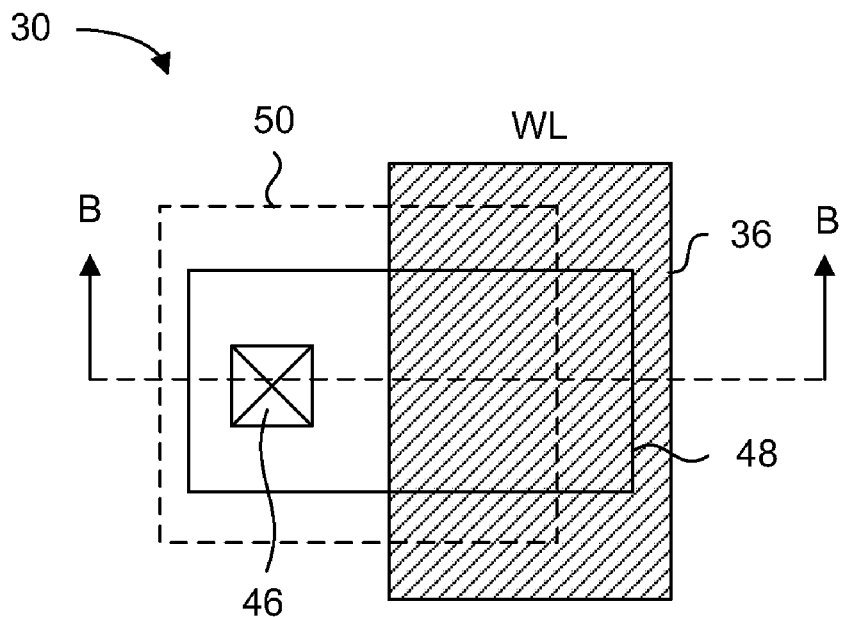
FIG. 4A is a planar layout of a variable thickness gate oxide anti-fuse transistor.
Figure 4B:
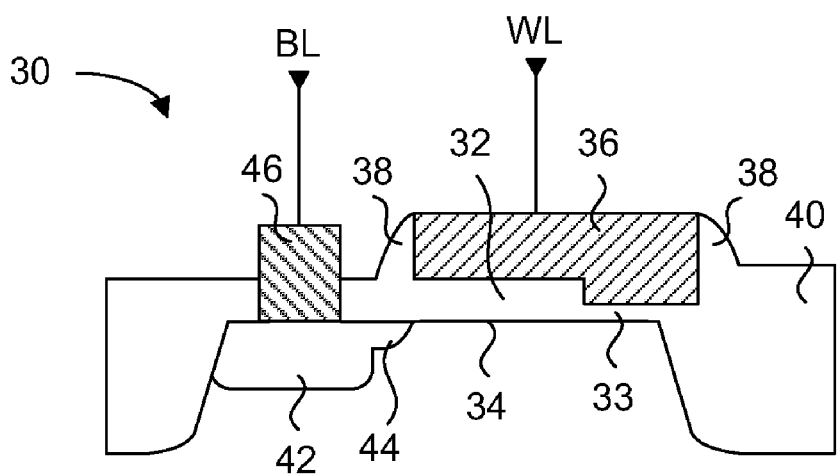
FIG. 4B is a cross-sectional view of the variable thickness gate oxide anti-fuse transistor of FIG. 4A.

FIG. 4B shows a cross-sectional view of an anti-fuse transistor taken along line B-B of the anti-fuse transistor show in FIG. 4A that can be manufactured with any standard CMOS process. This anti-fuse transistor and its variants are disclosed in commonly owned U.S. Pat. No. 7,402,855 issued on Jul. 22, 2008, and commonly owned U.S. Patent Publication No. 20070257331 A1 published on Nov. 8, 2007, the contents of which are incorporated by reference. In the presently shown example, the anti-fuse transistor is almost identical to a simple thick gate oxide, or input/output MOS transistor with one floating diffusion terminal. The disclosed anti-fuse transistor, also termed a split-channel capacitor or a half-transistor, can be reliably programmed such that the fuse link between the polysilicon gate and the substrate can be predictably localized to a particular region of the device. The cross-section view of FIG. 4B is taken along the channel length of the device. The channel is generally understood to be the area underneath an overlying polysilicon gate, having a length defined by edges of the polysilicon gate adjacent respective diffusion regions. Expressed in the alternative, the channel is underlying the polysilicon gate.

Anti-fuse cell 30 includes a variable thickness gate oxide formed on the substrate channel region 34, a polysilicon gate 36, sidewall spacers 38, a field oxide region 40, a diffusion region 42, and an LDD region 44 in the diffusion region 42. A bitline contact 46 is shown to be in electrical contact with diffusion region 42. The variable thickness gate oxide consists of a thick gate oxide 32 and a thin gate oxide 33 such that a portion of the channel length is covered by the thick gate oxide and the remaining portion of the channel length is covered by the thin gate oxide. Generally, the thin gate oxide is a region where oxide breakdown can occur. The thick gate oxide edge meeting diffusion region 42 on the other hand, defines an access edge where gate oxide breakdown is prevented and current between the gate 36 and diffusion region 42 is to flow for a programmed anti-fuse transistor. While the distance that the thick oxide portion extends into the channel region depends on the mask grade, the thick oxide portion is preferably formed to be at least as long as the minimum length of a high voltage transistor formed on the same chip.

In this example, the diffusion region 42 is connected to a bitline through a bitline contact 46, or other line for sensing a current from the polysilicon gate 36, and can be doped to accommodate programming voltages or currents. This diffusion region 42 is formed proximate to the thick oxide portion of the variable thickness gate oxide. To further protect the edge of anti-fuse cell 30 from high voltage damage, or current leakage, a resistor protection oxide (RPO), also known as a salicide protect oxide, can be introduced during the fabrication process to further space metal particles from the edge of sidewall spacer 38. This RPO is preferably used during the salicidiation process for preventing only a portion of diffusion region 42 and a portion of polysilicon gate 36 from being salicided. It is well known that salicided transistors are known to have higher leakage and therefore lower breakdown voltage. Thus having a non-salicided diffusion region 42 will reduce leakage. Diffusion region 42 can be doped for low voltage transistors or high voltage transistors or a combination of the two resulting in same or different diffusion profiles.

Figure 4C:
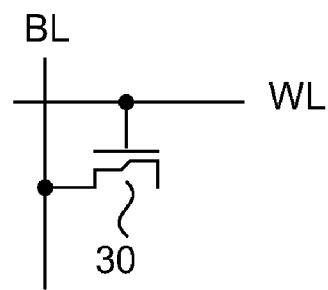
FIG. 4C is a transistor symbol representing the variable thick gate oxide anti-fuse transistor of FIGS. 4A and 4B.

A simplified plan view of the anti-fuse cell 30 is shown in FIG. 4A. Bitline contact 46 can be used as a visual reference point to orient the plan view with the corresponding cross-sectional view of FIG. 4B. The active area 48 is the region of the device where the channel region 34 and diffusion region 42 is formed, which is defined by an OD mask during the fabrication process. The dashed outline 50 defines the areas in which the thick gate oxide is to be formed via an OD2 mask during the fabrication process. More specifically, the area enclosed by the dashed outline 50 designates the regions where thick oxide is to be formed. OD simply refers to an oxide definition mask that is used during the CMOS process for defining the regions on the substrate where the oxide is to be formed, and OD2 refers to a second oxide definition mask different than the first. According to an embodiment of the present invention, the thin gate oxide area bounded by edges of the active area 48 and the rightmost edge of the OD2 mask, is minimized. In the presently shown embodiment, this area can be minimized by shifting the rightmost OD2 mask edge towards the parallel edge of active area 48. FIG. 4C is a schematic showing a transistor symbol representing the anti-fuse cell 30 shown in FIGS. 4B and 4A. As can be seen in FIG. 4C, anti-fuse cell 30 has its gate connected to a wordline and its diffusion region 42 connected to a bitline. Commonly owned U.S. Patent Application No. 20070257331 A1 published on Nov. 8, 2007, the contents of which is incorporated by reference, describes alternate single transistor anti-fuse memory cells which can be used in a non-volatile memory array.

The programming speed of an anti-fuse memory array consisting of anti-fuse cells 30 of FIGS. 4A to 4C is relatively slow in comparison to volatile memory such as SRAM or DRAM. Each programming cycle will attempt to program a certain number of bits at the same time. Following each programming step is a program verify step to ensure that the data bits were successfully programmed. Any bits that do not pass the program verify step are subjected to a reprogramming step. This process iterates until all the memory cell states have been successfully programmed, or if a maximum number of iterations are reached.

FIG. 5A shows how an unprogrammed anti-fuse memory cell, such as anti-fuse memory cell 30, is programmed. Anti-fuse memory cell 30 has its gate terminal connected to a wordline WL and its single diffusion region connected to a bitline BL. Programming is effected by biasing the bitline to VSS and driving the wordline to a high voltage level VPP. VPP is selected based on the process technology and thickness of the thin gate oxide that is sufficient for forming a conductive link between the polysilicon gate and the channel region.

A successfully programmed anti-fuse memory cell 30 is shown in FIG. 5B, where a conductive link 60 is formed between the polysilicon gate and the channel region. Conductive link 60 is schematically represented as a resistive connection between the wordline and the channel region under the thin gate oxide region of anti-fuse memory cell 30. Therefore a programmed anti-fuse transistor having a conductive link stores one logic state of one bit of data. Accordingly, an unprogrammed anti-fuse transistor will by default store the other logic state of one bit of data. To prevent programming of the anti-fuse memory cell 30, the bitline is biased to a positive voltage such as VDD while the wordline is driven to VPP. This will be sufficient for inhibiting the conductive link from forming.

Reading the anti-fuse transistor is achieved by driving the wordline to a read voltage VREAD, and by precharging the bitline to VSS, as shown in FIG. 5C. If the anti-fuse memory cell 30 has a conductive link 60, then the wordline will pull the bitline towards the VREAD voltage level via the conductive link 60 and the positive gate voltage of the anti-fuse transistor. This bitline voltage can be sensed and amplified by sense amplifier circuits. On the other hand, if the anti-fuse memory cell 30 is not programmed, ie. does not have a conductive link 60, then the bitline will remain at approximately VSS. According to the present embodiments, VREAD can be VDD or any positive voltage sufficiently high to turn on the anti-fuse memory call and charge its bitline to a positive voltage through the conductive link.

The above described anti-fuse memory cell 30 is one example of an OTP memory cell that can be used with the embodiments of the present invention. Those skilled in the art should understand that other types of anti-fuse memory cells, such as two-transistor anti-fuse memory cells and other OTP memory cells can be used with the embodiments of the present invention. From this point forward, it is assumed that any reference to memory cells or OTP memory cells in the embodiments, refers to anti-fuse memory cell 30.

According to a presently described embodiment, an OTP memory can be operated in one of four different read modes. A first mode is a default mode referred to as a single-ended read mode. The next three modes are generally referred to as multi-cell or high reliability modes of operation, in which at least two OTP memory cells store one bit of data. This is referred as multi-cell per bit storage. The single-ended read mode is described first with reference to FIG. 6A.

Figure 6A:
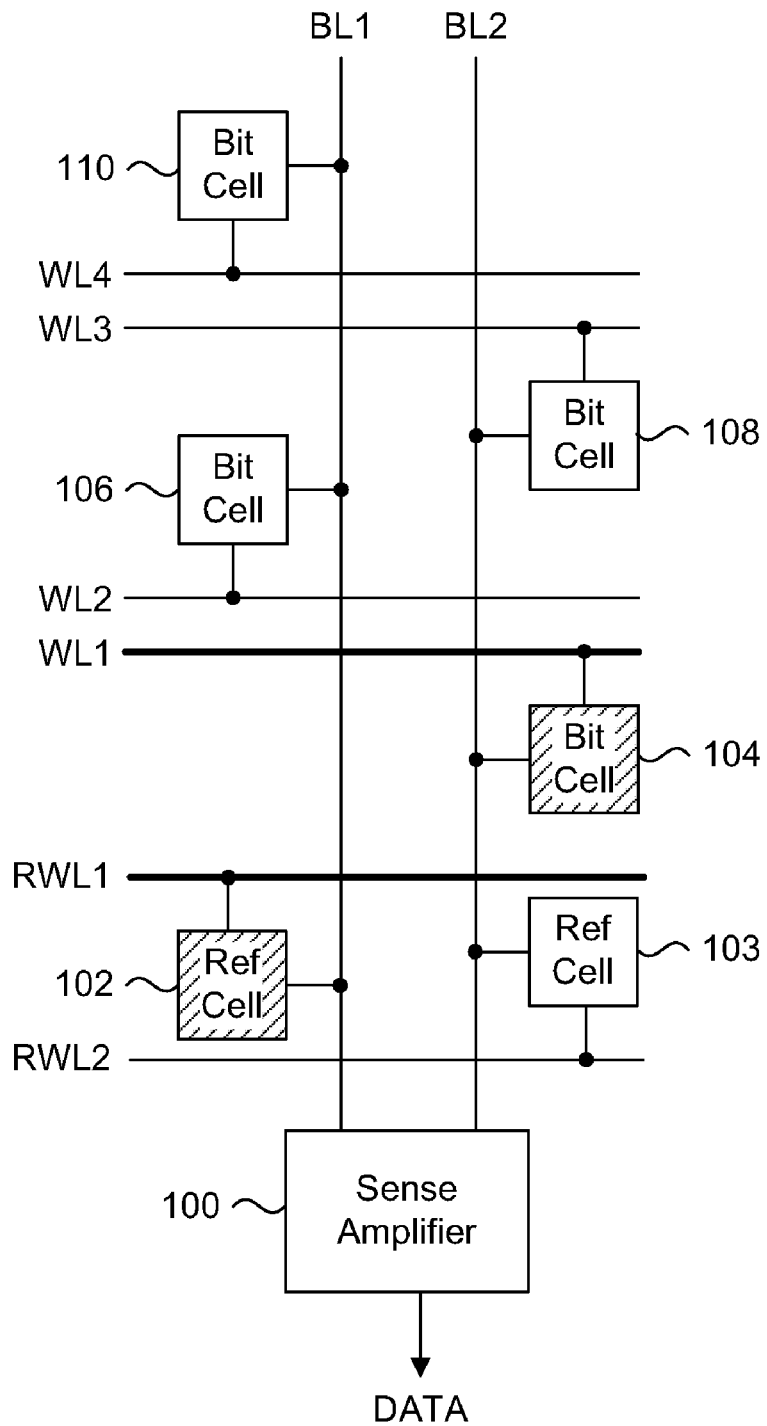
FIG. 6A is an illustration of a single-ended read mode according to a present embodiment.

FIG. 6A is a simplified schematic of an OTP memory array having bitlines BL1 and BL2 connected to a bitline sense amplifier 100 having a pair of complementary inputs, four wordlines WL1, WL2, WL3 and WL4, two reference wordlines WL1 and WL2, reference cells 102 and 103, and anti-fuse memory cells 104, 106, 108 and 110. An additional reference cell is connected to BL2, but not shown to simplify the schematic. Alternately, a circuit for providing a reference level can be used for applying the reference level onto either BL1 or BL2 instead. Each of the OTP memory cells has its gate terminal connected to a respective wordline, and has its single diffusion region connected to a respective bitline. It is first assumed that BL1 and BL2 are first precharged to VSS, followed by driving WL1 to a positive read voltage VREAD. Reference wordline RWL1 connected to reference cell 102 is driven such that the reference cell 102 provides a reference level onto BL1. If cell 104 is programmed, BL2 will have a bitline level that is greater than the reference level of BL1. Alternately, if cell 104 is not programmed, BL2 will have a bitline level that is less than the reference level of BL1. Sense amplifier 100 can detect both conditions to provide an output DATA corresponding to a logic "1" or "0" state, depending on the programmed state of cell 104.

It is noted that the presently described OTP memory array can be configured for voltage sensing or current sensing, by using the appropriate type of circuit for sense amplifier 100 and later for sense amplifier 120. In voltage sensing, the aforementioned bitline level is a voltage level that charges towards VREAD, while the reference level is set to some mid-point voltage level. In current sensing, the aforementioned bitline level is a current level determined largely by VREAD and the presence or absence of a conductive link in cell 104, while the reference level is set to a reference current level. Such a reference current level can be determined by setting geometric parameters of the reference cells 102 and 103, and/or by adjusting the voltage level of RWL1 and RWL2 for example. From this point on, it is assumed that voltage sensing is used in the following embodiments.

A problem with single cell per bit storage is the potential for cell 104 to be a weakly programmed cell. It is possible that the cell does not charge BL2 sufficiently high during the sensing period to enable sense amplifier 100 to detect the voltage difference against the reference voltage of BL1. Therefore the incorrect state of cell 104 may be sensed. In order to compensate for this possible scenario, any one of the high reliability modes of operation can be used.

Figure 6B:
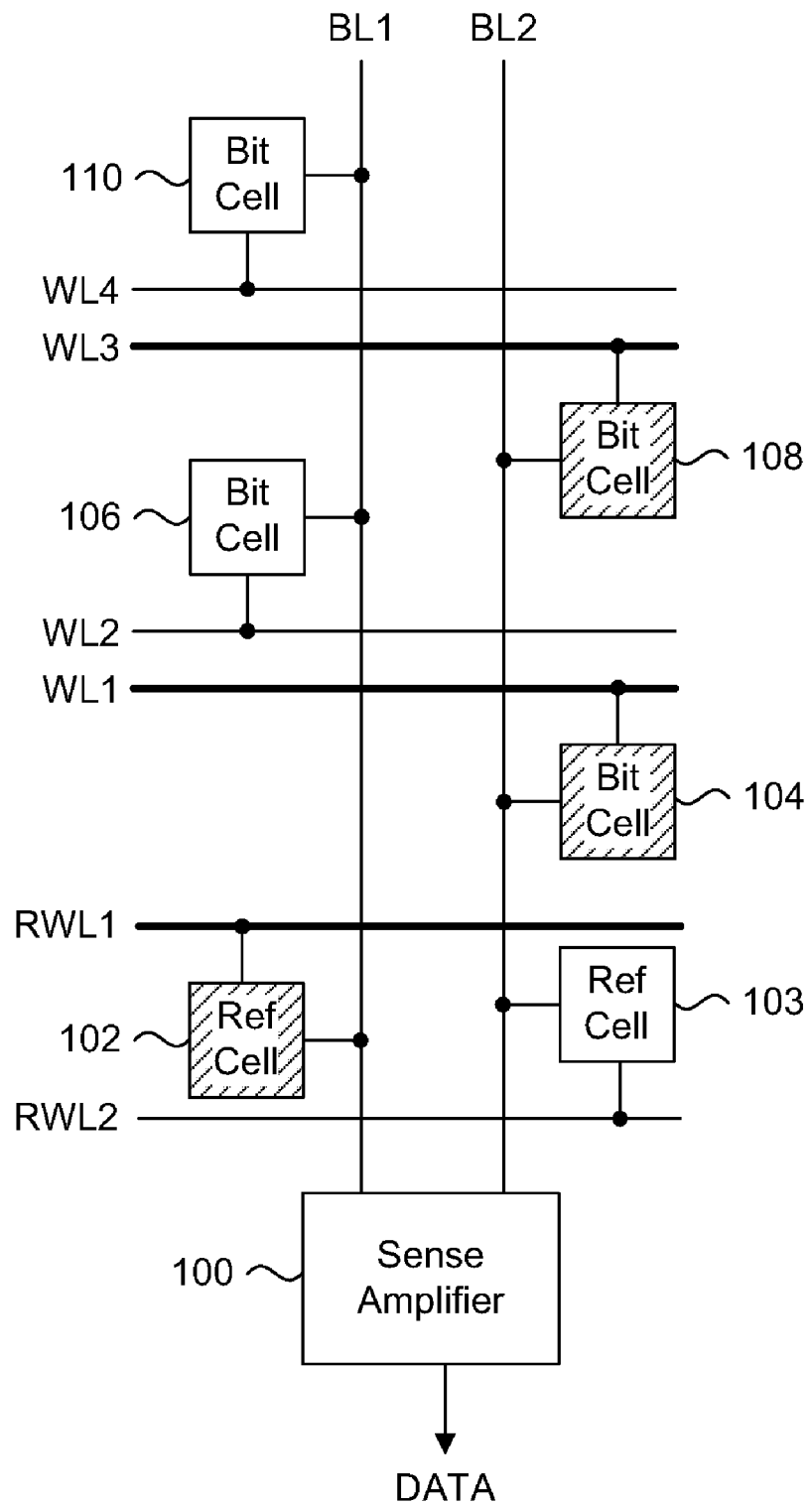
FIG. 6B is an illustration of a redundant read mode according to a present embodiment.

The first high reliability mode of operation is illustrated in FIG. 6B. This is referred to as a redundant read mode where one data bit is stored using two memory cells. In particular, two cells 104 and 108 connected to the same bitline BL2 store the same bit of data. For example, both cells 104 and 108 are programmed to store one logic state, or both cells 104 and 108 remain in the default unprogrammed state to store the opposite logic state. During the read operation, wordlines WL1 and WL3 are simultaneously driven to VREAD while a reference voltage is applied to BL1 via reference cell 102 by driving RWL1. The method of reading data is no different than for the single-ended read mode. The advantage of the redundant read mode is that the two cells are OR'd together, so if one cell is weakly programmed and is slow to charge BL1 to VREAD, its companion cell will compensate by providing an additional source for charging BL1 to VREAD. Hence a larger signal margin is provided by the redundant read mode relative to the single-ended read mode.

Any two cells connected to the same bitline can be activated at the same time for the redundant read mode. In an alternate embodiment, any number of cells connected to the same bitline can be activated at the same time for the redundant read mode.

Figure 6C:
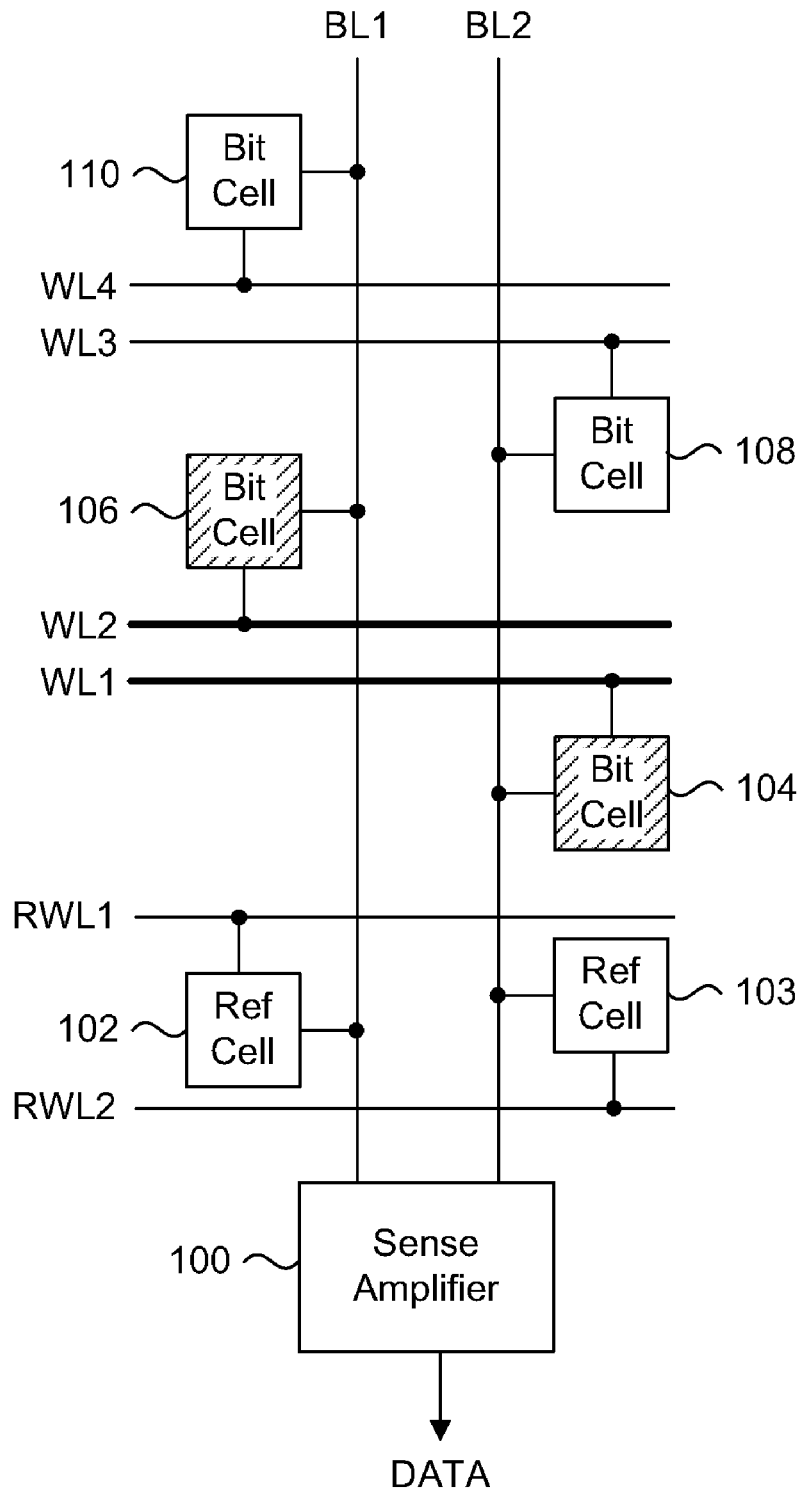
FIG. 6C is an illustration of a differential read mode according to a present embodiment.

The second high reliability mode of operation is illustrated in FIG. 6C. This is referred to as a differential read mode where one data bit is stored using two memory cells. In particular, one cell such as cell 104 connected to one bitline BL2 stores the true logical value of the data, while a second cell such as cell 106 connected the other bitline BL1 stores the complement of the true logical value of the data. In the differential read mode, one of the two cells is always programmed. For example, if cell 104 stores a logic "1" value, then cell 106 stores a logic "0" value. In the differential read mode, no reference voltage is required for bitlines BL1 or BL2, hence reference cells 102 and 103, or any reference circuit is not used. During the read operation, wordlines WL1 and WL2 are simultaneously driven to VREAD. Since BL1 and BL2 are precharged to VSS in this example, the unprogrammed cell does not substantially change the voltage of its respective bitline. However, the programmed cell charges its respective bitline towards VREAD. Therefore the sense amplifier 100 compares cells 104 and 106 against each other to provide a determination of the true logic state of the data stored in cell 104. Accordingly, the read margin provided by the differential read mode is significantly improved over the single-ended read mode. Therefore, even a weakly programmed cell can be sensed by sense amplifier 100 since the bitline it is connected to is compared to a bitline precharged to VSS.

An advantage of the differential read mode is that the power signature is the same independent of the data that is read, because one of the two cells will always be programmed. A power signature could enable one to help determine the contents of the word being read. This is because the amount of current being consumed during the read operation depends on the stored states of data in the cells being read. However, when data is stored and read in the differential or the differential redundant mode, it is not possible to determine if there are more '1's or '0's in the word since the current signature from the array will always be the same. Therefore the data is effectively "masked" when stored and read in the differential or differential redundant mode.

Figure 6D:
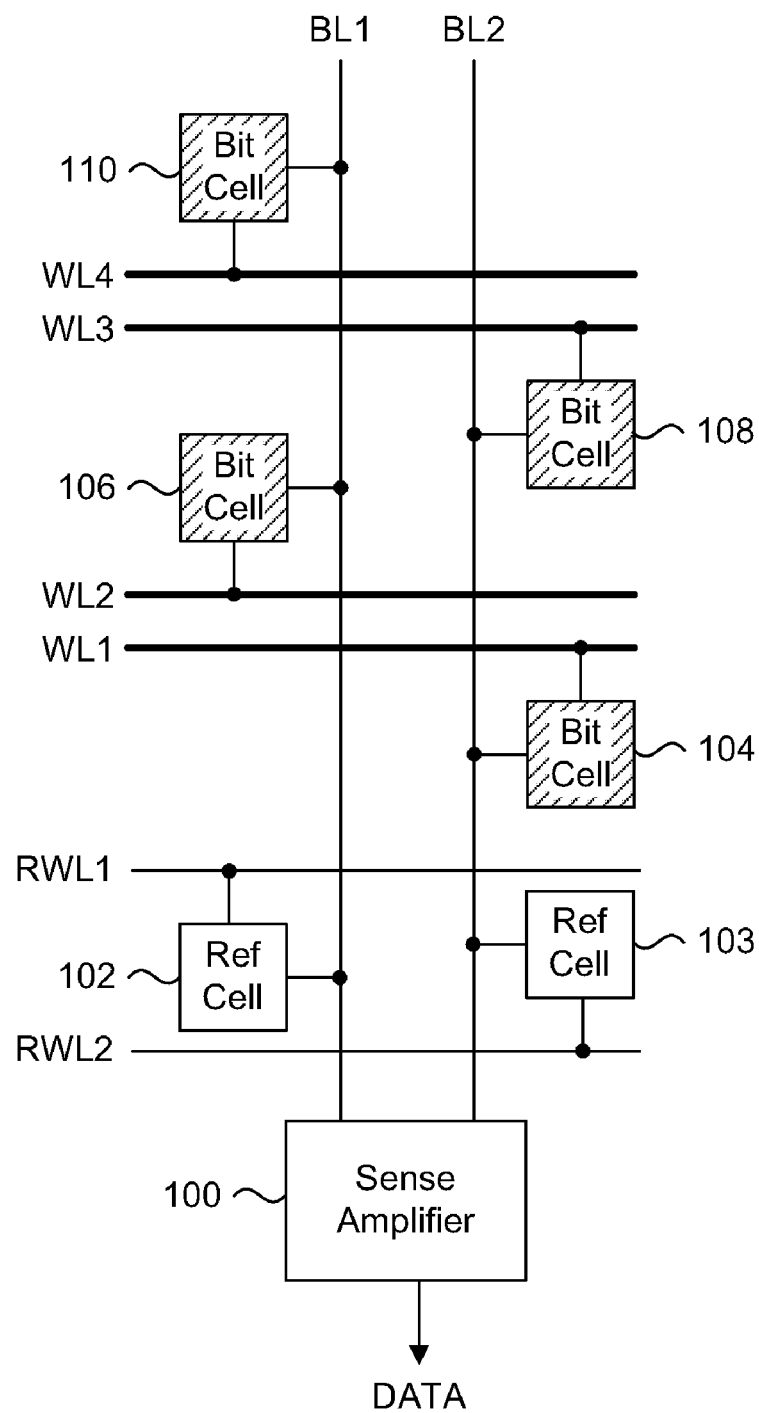
FIG. 6D is an illustration of a differential-redundant read mode according to a present embodiment.

The third high reliability mode of operation is illustrated in FIG. 6D. This is referred to as a differential-redundant read mode where one data bit is stored using four memory cells. The differential-redundant read mode combines the techniques of the redundant read mode and the differential read mode. In particular, two cells such as cells 104 and 108 connected to one bitline BL2 each stores the true logical value of the data, while two cells such as cells 106 and 110 connected the other bitline BL1 each stores the complement of the true logical value of the data. During the read operation, wordlines WL1, WL2, WL3 and WL4 are simultaneously driven to VREAD. If it assumed that cells 104 and 108 are programmed with a logic "1", then cells 106 and 110 remain at the unprogrammed "0" logic state. Since BL1 and BL2 are precharged to VSS in this example, the unprogrammed cells 106 and 110 do not substantially change the voltage of bitline BL1. However, both cells 104 and 108 will drive BL2 towards VREAD, even if one or both of the cells are weakly programmed. The sense amplifier 100 will be able to sense the voltage differential between BL1 and BL2. Therefore, the differential-redundant read mode provides the inherent redundancy of the redundant read mode and the additional margin provided by the differential read mode. As with the differential mode, there is no power signature for any read operation.

Following is a discussion of a wordline addressing scheme for all four modes of operation in an example memory array. It is assumed that the example memory array has 64 wordlines, logically divided into 16 groups of wordlines where each of the 16 wordline groups includes 4 wordlines. To access one memory cell in the single-ended read mode, one wordline of the 64 wordlines is driven with a read voltage. Accordingly, a row address consisting of 6 bits is required. To access two memory cells at the same time in the redundant read mode, two wordlines of the 64 wordlines are concurrently driven with a read voltage. In this example, the two wordlines should be within one of the 16 logical groups. Therefore, 4 of the 6 address bits are used to select one of the 16 logical groups, thereby leaving the remaining 2 address bits to select any one of the four wordlines in the group. To select any two wordlines at the same time within the group, one of the remaining 2 address bits is masked or disabled, thereby allowing concurrent selection of two wordlines. This same addressing principle applies to the differential read mode. To access four memory cells at the same time in the differential-redundant read mode, 4 of the 6 address bits are used to select one of the 16 logical groups and the remaining 2 address bits are masked or disabled. Logic circuits can be arranged to enable and disable the addressing bits in the above described manner in response to control signals that are provided based on the selected read mode.

FIGS. 6B to 6D shows embodiments where the 2 cells or 4 cells are clustered together via a physical grouping of four adjacent wordlines. In an alternative embodiment, the 2 cells or 4 cells can be dispersed and spread out along the bitline direction. For example, a first wordline and a last wordline of the memory array can be simultaneously driven in the differential or redundant read modes.

Figure 6E:
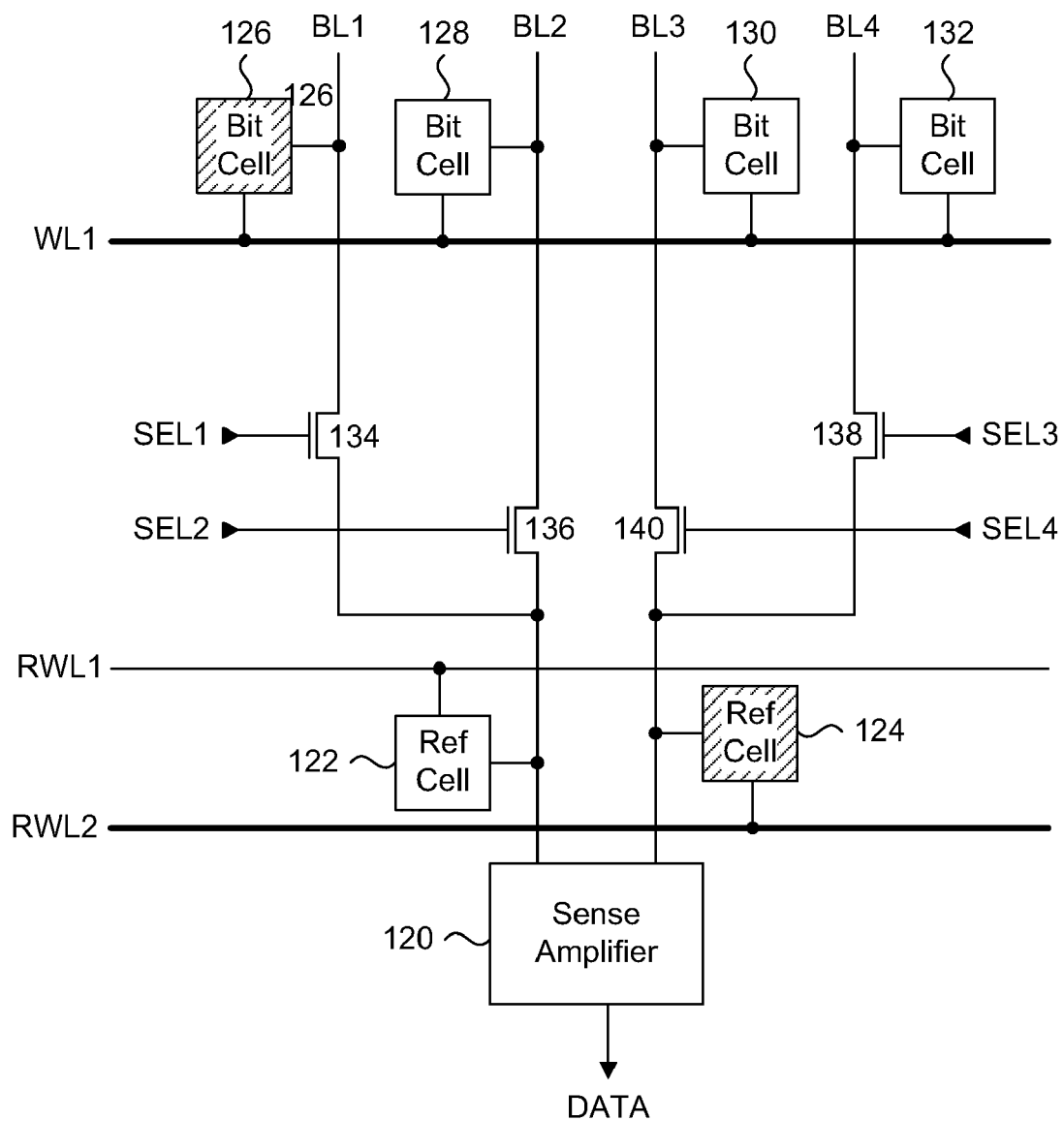
FIG. 6E is an illustration of an alternate single-ended read mode according to according to a present embodiment.

FIGS. 6B to 6D illustrate embodiments where the high reliability modes of operation are enabled by selectively driving 2 or 4 wordlines at the same time to access multiple cells connected to one bitline or a pair of bitlines. Hence the high reliability modes of operation shown in FIGS. 6B to 6D are row controlled and the specific mode of operation is set by controlling the wordlines. According to an alternate embodiment, the high reliability modes of operation are column controlled, meaning that the specific mode of operation is set by controlling which bitlines to access. FIG. 6E shows an alternate single-ended read mode, while FIGS. 6F to 6H show alternate embodiments of the high reliability modes of operation shown in FIGS. 6B to 6D.

FIG. 6E is a simplified schematic of an OTP memory array having four bitlines BL1, BL2, BL3 and BL4 connected to a bitline sense amplifier 120, a wordline WL1, reference cells 122 and 124, and anti-fuse memory cells 126, 128, 130 and 132. All four cells 126, 128, 130 and 132 have their gate terminals connected to WL1, while a first reference wordline RWL1 has its gate terminal connected to reference cell 122 and a second reference wordline RWL2 has its gate terminal connected to reference cell 122. Alternately, a circuit for providing a reference charge can be used for applying a reference charge or voltage onto any of bitlines BL1, BL2, BL3 and BL4 instead. Bitlines BL1, BL2, BL3 and BL4 are selectively coupled to sense lines of bitline sense amplifier 120 through column select devices 134, 136, 138 and 140, which in the present embodiment are n-channel transistors. Each of the column select devices 134, 136, 138 and 140 is controlled by a respective column select signal SEL1, SEL2, SEL3 and SEL4. In the present alternate memory array configuration, each of the OTP memory cells has its gate terminal connected to the same wordline WL1, and has its single diffusion region connected to a respective bitline. In the presently shown example arrangement, bitlines BL1 and BL2 can be selectively connected to a first sense line of sense amplifier 120, while bitlines BL3 and BL4 can be selectively connected to a second sense line of sense amplifier 120.

It is assumed in the presently described example that cell 126 is to be read in the single-ended mode. It is first assumed that BL1, BL2, BL3 and BL4 are first precharged to VSS while all the column select devices 134, 136, 138 and 140 are turned off. Then WL1 is driven to a positive read voltage VREAD. Reference wordline RWL2 connected to reference cell 124 is driven concurrently with WL1 being driven. Subsequently, column select signal SEL1 is driven to turn on column select device 134, thereby connecting BL1 to sense amplifier 120. Accordingly, sense amplifier 120 compares the charge on BL1 to the charge on the sense line connected to reference cell 124. If cell 126 is programmed, BL1 will charge towards VREAD and exceed the reference voltage of the sense line connected to reference cell 124. Alternately, if cell 126 is not programmed, BL1 will remain substantially at the precharged VSS level that is less than the reference voltage of the sense line connected to reference cell 124. Sense amplifier 120 can detect both conditions to provide an output DATA corresponding to a logic "1" or "0" state, depending on the programmed state of cell 126.

Figure 6F:
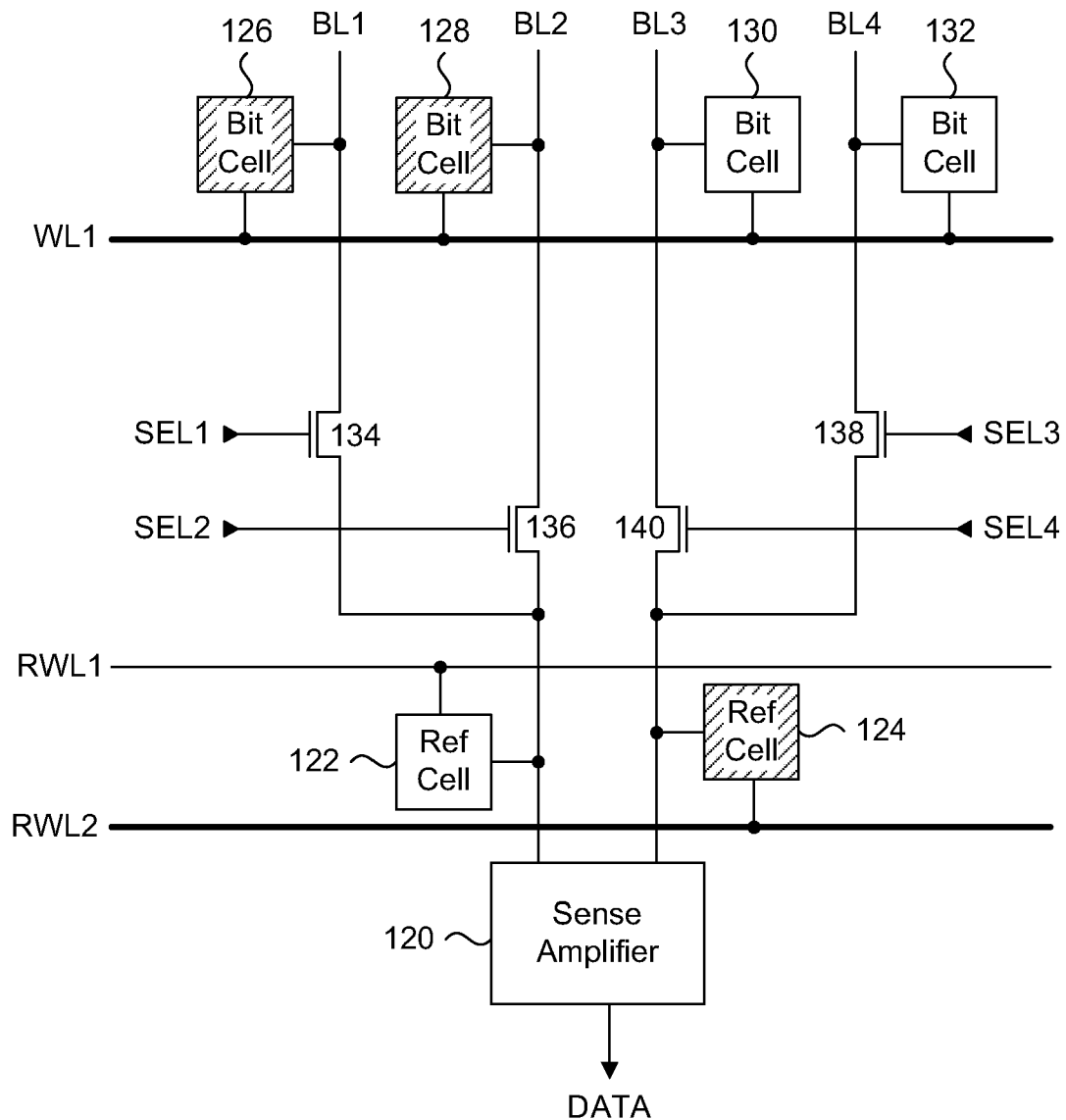
FIG. 6F is an illustration of an alternate redundant read mode according to a present embodiment.
Figure 6G:
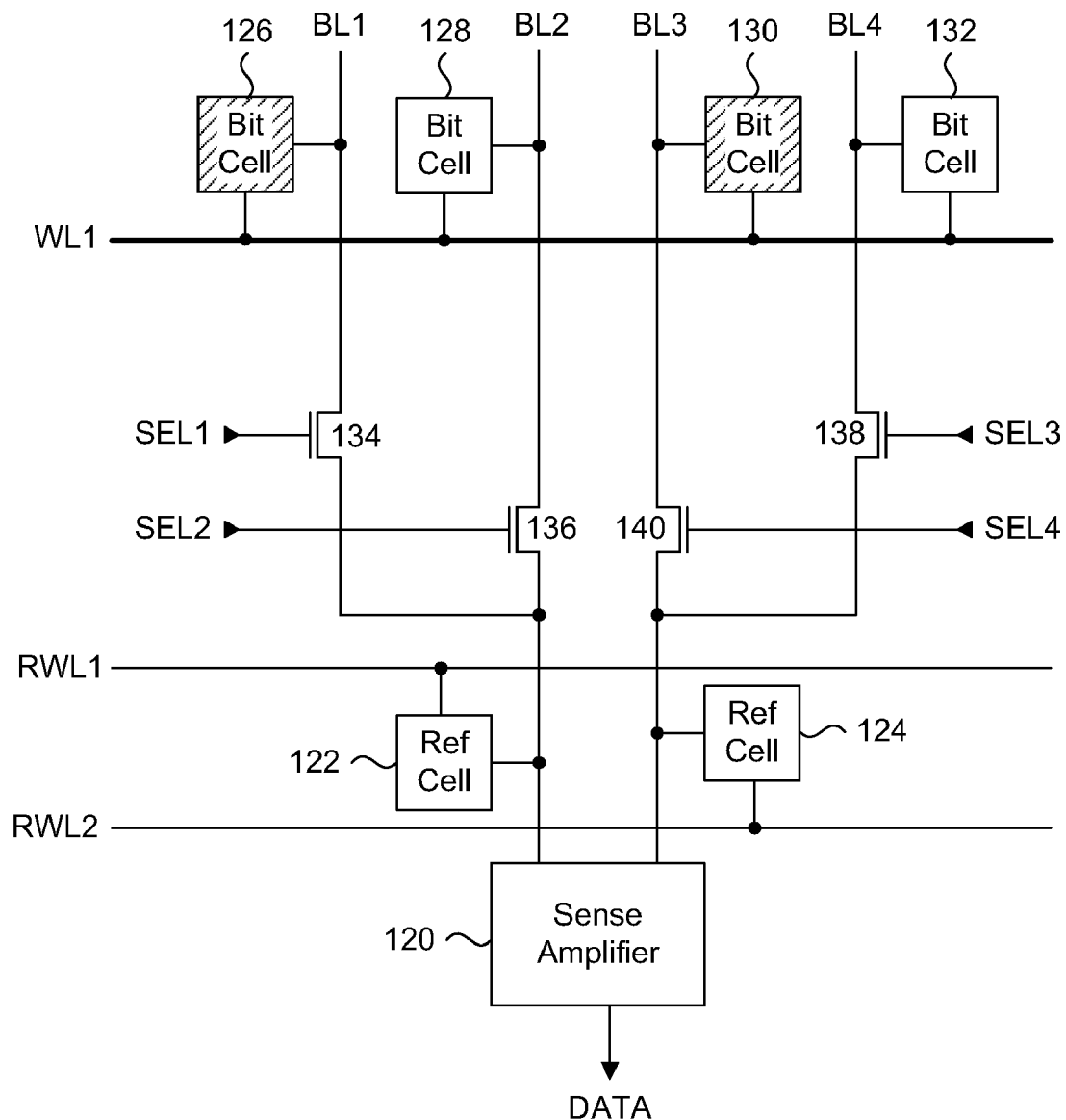
FIG. 6G is an illustration of an alternate differential read mode according to a present embodiment.
Figure 6H:
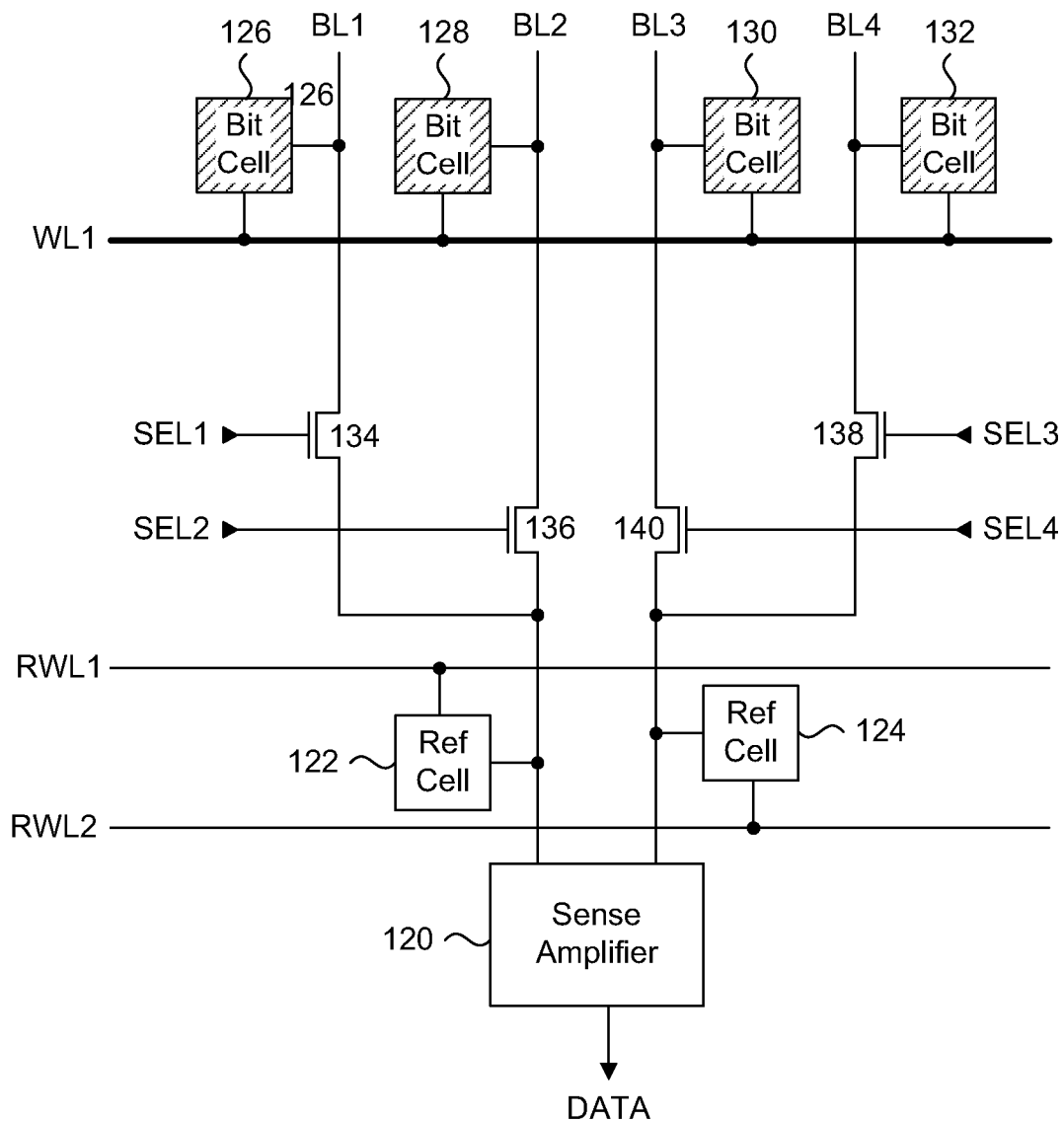
FIG. 6H is an illustration of an alternate differential-redundant read mode according to a present embodiment.

The single wordline redundant read mode is illustrated in FIG. 6F. Here one data bit is stored using two memory cells. In this example, two cells 126 and 128 connected to the bitlines BL1 and BL2 store the same bit of data. For example, both cells 126 and 128 are programmed to store one logic state, or both cells 126 and 128 remain in the default unprogrammed state to store the opposite logic state. During the read operation, wordline WL1 is driven to VREAD while a reference voltage is applied to the sense line connected to reference cell 124. Then both column select devices 134 and 136 are turned on, thereby connecting both cells 126 and 128 to the same input of sense amplifier 120. Hence the charges of BL1 and BL2 are added together. The method of reading data is no different than for the single-ended read mode shown in FIG. 6E. The advantage of the redundant read mode is that the two cells are OR'd together, so if one cell is weakly programmed and is slow to charge BL1 to VREAD, its companion cell will compensate by providing an additional source for charging BL2 to VREAD. Hence a larger signal margin is provided by the redundant read mode relative to the single-ended read mode. Alternately, both cells 130 and 132 can be selected by turning on or enabling column select devices 138 and 140, and driving RWL1 instead of RWL2.

The single wordline differential read mode is illustrated in FIG. 6G, where one data bit is stored using two memory cells. In particular, one cell such as cell 126 connected to one bitline BL1 stores the true logical value of the data, while a second cell such as cell 130 connected another bitline BL3 stores the complement of the true logical value of the data. In the differential read mode, one of the two cells is always programmed. For example, if cell 126 stores a logic "1" value, then cell 130 stores a logic "0" value. In the differential read mode, no reference voltage is required, hence reference cells 122, 124 or any reference circuit is not used. During the read operation, wordline WL1 is driven to VREAD. Since BL1 to BL4 are precharged to VSS in this example, the unprogrammed cell does not substantially change the voltage of its respective bitline. However, the programmed cell charges its respective bitline towards VREAD. Then column select devices 134 and 140 are turned on to electrically couple bitlines BL1 and BL3 to sense amplifier 120. Therefore the sense amplifier 120 compares cells 126 and 130 against each other to provide a determination of the true logic state of the data stored in cell 126. Accordingly, the read margin provided by the differential read mode is significantly improved over the single-ended read mode. Therefore, even a weakly programmed cell can be sensed by sense amplifier 120 since the bitline it is connected to is compared to a bitline precharged to VSS. An advantage of the differential read mode is that the power signature is the same independent of the data that is read, because one of the two cells will always be programmed.

The third high reliability mode of operation is illustrated in FIG. 6H. This is referred to as a differential-redundant read mode where one data bit is stored using four memory cells. The differential-redundant read mode combines the techniques of the redundant read mode and the differential read mode. In particular, two cells such as cells 126 and 128 connected to bitlines BL1 and BL2 each stores the true logical value of the data, while two cells such as cells 130 and 132 connected bitlines BL3 and BL4 each stores the complement of the true logical value of the data. During the read operation, wordline WL1 is driven to VREAD. If it assumed that cells 126 and 128 are programmed with a logic "1", then cells 130 and 132 remain at the unprogrammed "0" logic state. Since all four bitlines BL1 to BL4 are precharged to VSS in this example, the unprogrammed cells 130 and 132 do not substantially change the voltage of bitlines BL3 and BL4. However, both cells 126 and 128 will drive bitlines BL1 and BL2 towards VREAD, even if one or both of the cells are weakly programmed. Then all column select devices 134, 136, 138 and 140 are turned on to couple bitlines BL1 and BL2 to one input of sense amplifier 120, and bitlines BL3 and BL4 to the other input of sense amplifier 120. Hence the charges of BL1 and BL2 are added together, while the charges of BL3 and BL4 are added together. The sense amplifier 120 will be able to sense the voltage differential between BL1 and BL2. Therefore, the differential-redundant read mode provides the inherent redundancy of the redundant read mode and the additional margin provided by the differential read mode. As with the differential mode, there is no power signature for any read operation.

In the previously shown embodiments of FIGS. 6F to 6H, memory cells are connected to 2 bitlines for improving reliability. In further alternate embodiments, memory cells connected to more than two bitlines can be multiplexed onto each input of the sense amplifier 120. The column select signals SEL1 to SEL4 in the above described embodiments can be dynamically decoded using the same techniques described for decoding the wordlines to be activated for the different high reliability modes.

In summary, the embodiments of FIGS. 6B to 6D and the embodiments of FIGS. 6F to 6H use a select circuit which is configurable to couple a variable number of anti-fuse memory cells to a sense amplifier at the same time, in response to an address and a selected read mode of operation. In the embodiments of FIGS. 6B to 6D, the select circuit includes at least row decoding circuits that receive a row address. In the embodiments of FIGS. 6F to 6H, the select circuit includes at least column decoding circuits that receive a column address. Row decoding and column decoding is discussed later with reference to FIG. 7.

Figure 7:
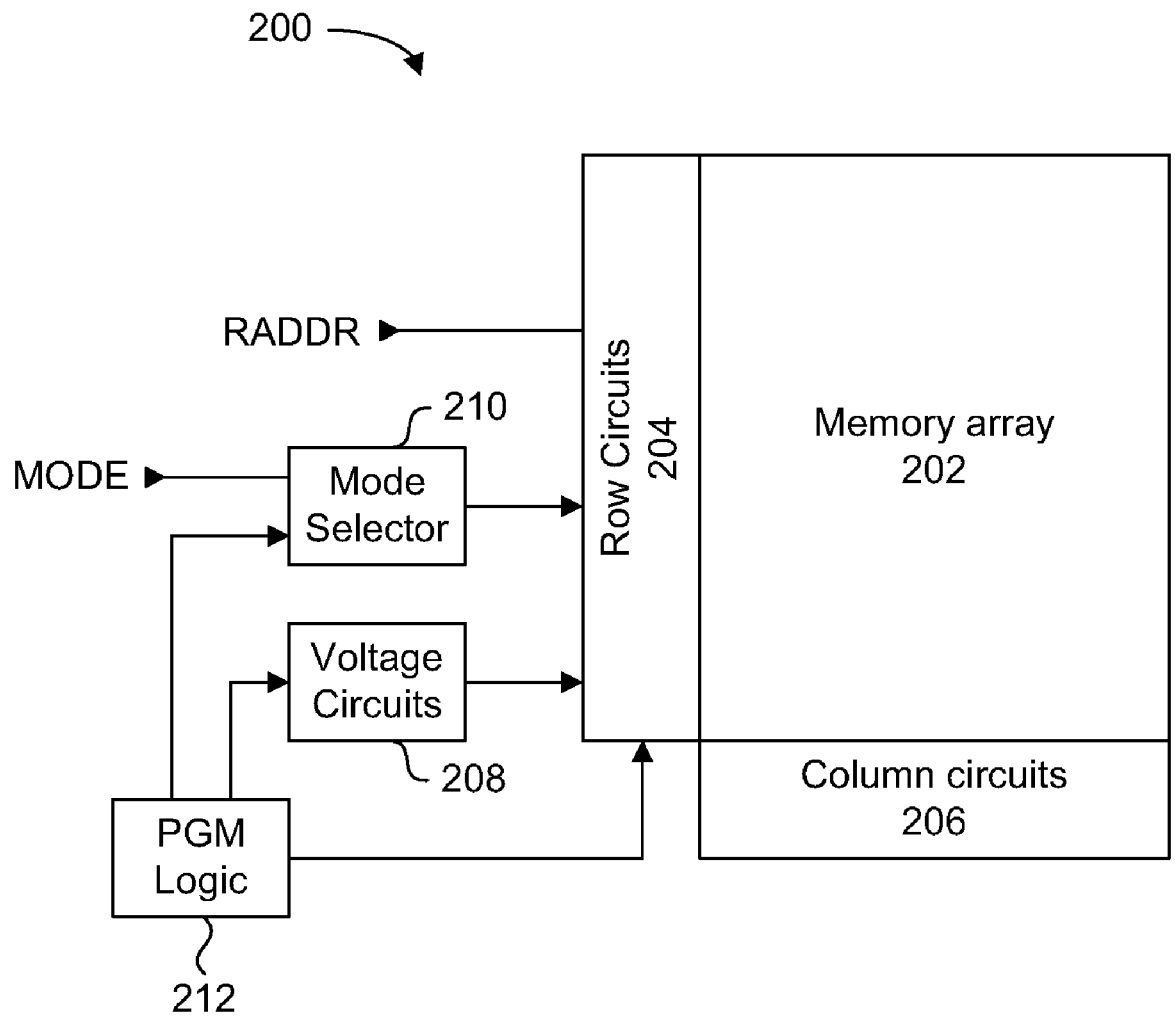
FIG. 7 is a block diagram of an OTP memory system, according to a present embodiment.

Therefore in the present embodiments, all the high reliability modes of operation can be dynamically selectable in an OTP memory array. Use of the high reliability modes will increase voltage and temperature operating margins, operating speed and improve data security for end users, while increasing manufacturing yield. Furthermore, the memory can be configured such that different parts of the memory array operate with different read modes. For the row controlled high reliability modes by example, this can be achieved by setting row address ranges where the different read modes are to be used. For the column controlled high reliability modes by example, this can be achieved by setting column address ranges where the different read modes are to be used. FIG. 7 is a block diagram of an OTP memory array according to the present embodiment.

The memory system 200 of FIG. 7 includes a memory array 202 having bitlines and wordlines connected to OTP cells, row circuits 204 coupled to the wordlines, and column circuits 206 coupled to the bitlines. The row circuits 204 include row decoders that receive a row address RADDR, and wordline drivers for driving wordlines selected by the row decoders during read and program operations. Row decoding circuits and wordline driver circuits are well known in the art. The column circuits include input/output data path circuits such as sense amplifiers for outputting read data and data registers for receiving input data, column decoders, and optionally, program verification logic for determining if the data was programmed successfully or not. The row circuits 204 can be configured for dynamic selection of more than one wordline to enable any of the row controlled high reliability modes of operation. Similarly, the column circuits 206 can be configured for dynamic selection of more than one bitline to enable any of the column controlled high reliability modes of operation. The row circuits 204 and the column circuits 206 may include additional logic that is not described here, but should be understood by those of skill in the art as being present for proper operation of the memory array.

The memory system 200 further includes voltage circuits 208, mode selector 210 and control logic 212. The voltage circuits 208 provides at least one read voltage and at least one programming voltage. In one embodiment, the at least one read voltage is provided to the wordline drivers of the row circuits 204, that pass the at least one read voltage to selected wordlines during read operations. The programming voltage is provided to the wordline drivers of the row circuits 204 that pass the programming voltage to selected wordlines during programming operations. Wordline driver circuit configurations for selectively providing different voltages are well known in the art.

The mode selector 210 includes logic that decodes a read mode signal MODE received from the end-user, and provides one or more corresponding control signals to the row decoders of row circuits 204. These control signals disable decoding of specific row addresses to enable multiple wordlines to be selected at the same time. For example, 2 or 4 wordlines can be selected at the same time for read operations as previously described. Configurable decoding logic for performing this function is known in the art. While not shown in FIG. 7, mode selector 210 can provide control signal to the column circuits 206 for controlling column address decoding to enable the column controlled high reliability modes of operation by selecting how many and which bitlines are to be coupled to the inputs of the sense amplifier.

The control logic 212 can include a state machine which executes a programming operation that includes program and verify steps for OTP memory, and in particular, for anti-fuse memory. This programming operation is discussed in further detail later. The control logic 212 controls the row circuits 204, the voltage circuits 208 and the mode selector 210 during the programming operation. More specifically, the single-ended read mode over-rides the user selected mode of operation via MODE during programming operations. There are many logic techniques for implementing this function. As will be described later, data is programmed one bit at a time and verified using the single-ended read mode. Once the programming operation is completed, the control logic 212 releases the mode selector 210 from the single-ended mode of operation, and allows the MODE signal to set the selected read mode. The voltage circuits 208 are controlled by the programming logic 208 to provide the programming voltage level and different read voltages at different stages of the programming operation. These voltages are asserted onto the selected wordlines during the programming operation by the wordline drivers of the row circuits 204.

In one embodiment, the column circuits 206 can include a data register with integrated program verify logic similar to the data register disclosed in PCT Publication WO 2008/077237. These circuits can be controlled by the control logic 212 to perform different types of verification after programming, and to determine which bits have been successfully programmed. The control logic 212 controls the row circuits 204, the voltage circuits 208 and the mode selector 210 to execute the above-described operations in the proper sequence during the programming operation.

Figure 8:
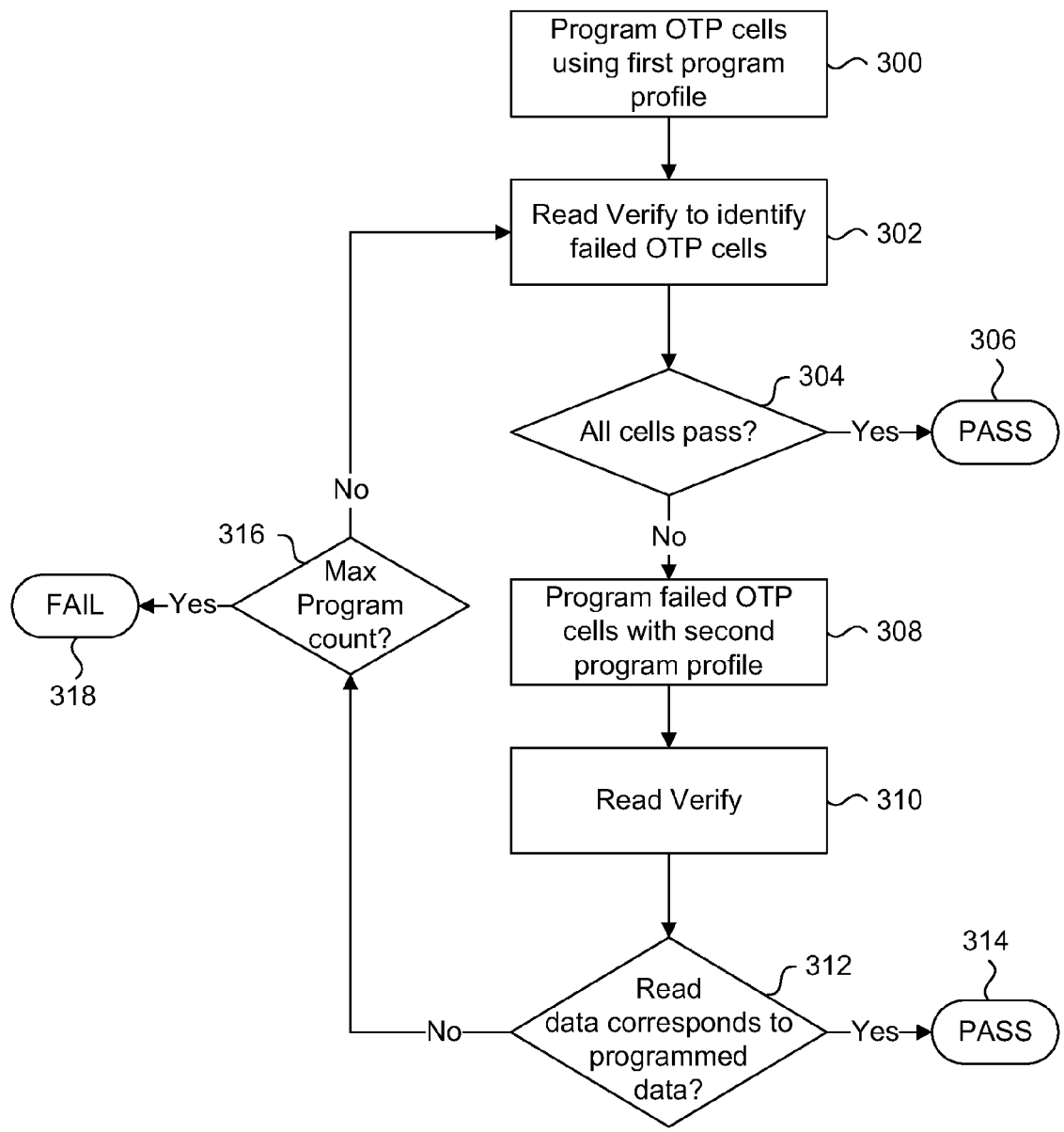
FIG. 8 is a flow chart showing a programming method, according to a present embodiment.

Following is a description of the programming operation, according to a present embodiment. FIG. 8 is a flow chart illustrating the sequence of the different phases or steps of the programming operation, which can be executed by the control logic 212 of FIG. 7. All bits are programmed in the single-ended mode, meaning that cells connected to one wordline or row are programmed at the same time in one programming cycle or operation. Therefore based on the desired high reliability read mode for a bit of data, one or more supplementary bits are pre-prepared for programming the cells connected to another wordline. Taking for example the differential read mode of FIG. 6C, input data of logic "1" is received in the data register and a first programming cycle programs cell 104 connected to WL1. For a second programming cycle, supplementary input data of logic "0" is received in the same data register and programmed to cell 106 connected to WL2. In the present embodiments, an input data of logic "0" means that no programming is effected in the cell. The flow chart of FIG. 8 presents the sequence for a single iteration of the programming cycle.

The programming cycle begins at step 300 where the cells are programmed with default programming parameters.

These parameters can include parameters such as a particular VPP voltage level and/or duration of the applied VPP voltage on the selected wordline, the duration being referred to as tPP1 (time of applied VPP). In the present embodiment, the selected wordline is driven to a default VPP level for a relatively short duration of time, such as about 50 microseconds for example. A short programming time minimizes power consumption, and power consumption can be further reduced if a voltage less than VPP is used at step 300. This reduced VPP voltage can be selected as the lowest VPP level for a known process technology that enables formation of a conductive link in the anti-fuse memory cell. Those skilled in the art understand that modeling techniques can be used to determine his level since the fabrication process and geometry of memory cells is known. Since there is no guarantee that all the cells were successfully programmed at step 300, a program verification algorithm is executed, starting with a first read verify operation at step 302. This read verification step uses an aggressive first read voltage to identify weakly programmed cells or cells that failed to program. The first read voltage can be a voltage appearing on the selected wordline that is weaker than the nominal read voltage used during normal read operations. Use of a lower read voltage will reduce power consumption as well.

For example, this first read voltage can be less than the nominal positive read voltage. Any cells that read out the expected data under this condition will certainly read out properly with the higher nominal read voltage. Thus, any weakly programmed cells and failed cells are identified at step 302 are considered cells that failed to program. At step 302, the cells that have properly read out are inhibited from further programming. For example, the anti-fuse memory cell shown in FIG. 5A requires its bitline to be biased to VSS to enable formation of its conductive link for programming. Therefore, the bitlines for the cells that have properly read out are biased to VDD or some other positive voltage level to inhibit reprogramming. If a data register is used for storing the bits of the input data to be programmed, one technique to inhibit successfully programmed cells from further programming is to invert the input data bit stored in the data register stage associated with the bit, using integrated comparison logic. Another technique is to read out the data during step 302 and re-enter the input data with adjustments to ensure that only the failed bits are reprogrammed.

Returning to step 304, program verify logic in the column circuits 206 or circuits external to the memory device determine if all the cells subjected to programming were successfully programmed. If all have been programmed successfully, then the program operation ends at step 306. Otherwise, there is at least one cell that did not successfully program. Proceeding to step 308, only the cells identified in step 302 as failing to program are programmed again with second programming parameters. For anti-fuse memory cells, this is also referred to as program soaking to form the conductive link or improve the conductive characteristics of an existing link. Ideally, all cells should be successfully programmed after step 308, therefore the second programming parameters can increase the VPP voltage level used at step 300 and/or increase the duration of application of VPP at step 300. If a reduced VPP voltage level was used at step 300, then a default or maximum VPP voltage can be used at step 308. Cumulative programming should eventually result in a sufficiently programmed cell. In the present example, if a duration of applied VPP time different than tPP1 is used, then a second and different VPP application time referred to as tPP2 (time of applied VPP) is used. For example, tPP2 can be set to be about 500 microseconds. At step 310, a second read verify is executed to read out the data in the single-ended mode, but using a second read voltage greater than the first read voltage used at step 302.

It is noted that this second read voltage can be less than the nominal read voltage, or it can be at the nominal read voltage used during normal read operations if an acceptable margin is provided through timing or setting of a particular reference voltage level for sensing during the single-ended read mode. Furthermore, if the target read mode is either the differential or differential-redundant read mode, then the nominal read voltage used during normal read operations can be less than the second read voltage used in the single ended read mode verify step.

A determination is made at step 312 to see if all the bits read from step 310 correspond to the input data. This determination can use the same techniques previously described for step 302. If they all the read out bits correspond to their respective input data bits, then the method ends at step 314 as all cells have been programmed. Because a nominal read voltage resulted in successful reading of all the programmed bits, the cells should read properly during normal single-ended read operations. Therefore the programmed bits will read properly during any of the high reliability read modes, as they provide redundancy and improved read margins over the single-ended mode. Returning to step 312, if there is at least one cell that is read out with a logic state that does not correspond to its respective input bit, then the cell failed to program. In the present embodiment, there is no need to identify the specific cells which have failed programming at step 310 or step 312. The method has finished one iteration of the program cycle, where the number of iterations can be tracked by a counter. The method proceeds to step 316 where the total number of iterations is compared to a predetermined maximum count. If the total number of iterations matches the maximum count, then it is likely that the cell or cells that are being repeatedly programmed are defective and unprogrammable. It is then determined that the program operation has failed at step 318. Otherwise, the method loops back to step 302 for another iteration.

It is noted that cells reprogrammed at step 308 which are read properly under the second read voltage at step 310 may not read properly under the lower first read voltage of 302. Conversely, there may be cells that are sufficiently or strongly programmed after step 308. Hence an advantage of repeating the cycle at step 302 is that these strongly programmed cells are inhibited from further programming, thereby reducing power consumption at subsequent program step 308 as there would be less cells to reprogram.

The method then iterates until either all cells pass at step 306 or step 314, or until the maximum number of iterations is reached. Optionally, after the pass status is obtained at step 306 or step 314, a final read verify using the target high reliability mode can be executed to finally confirm that the input data has been properly programmed. This final read verify operation can be executed with the worst case voltage and time parameters, for example where a low read voltage is asserted on the selected wordlines and the sense amplifiers are activated in a short period of time after the selected wordlines are driven to the low read voltage. If the data is read out successfully under the worst case parameters, then the memory device has been finally validated to store the data with high reliably.

Figure 9:
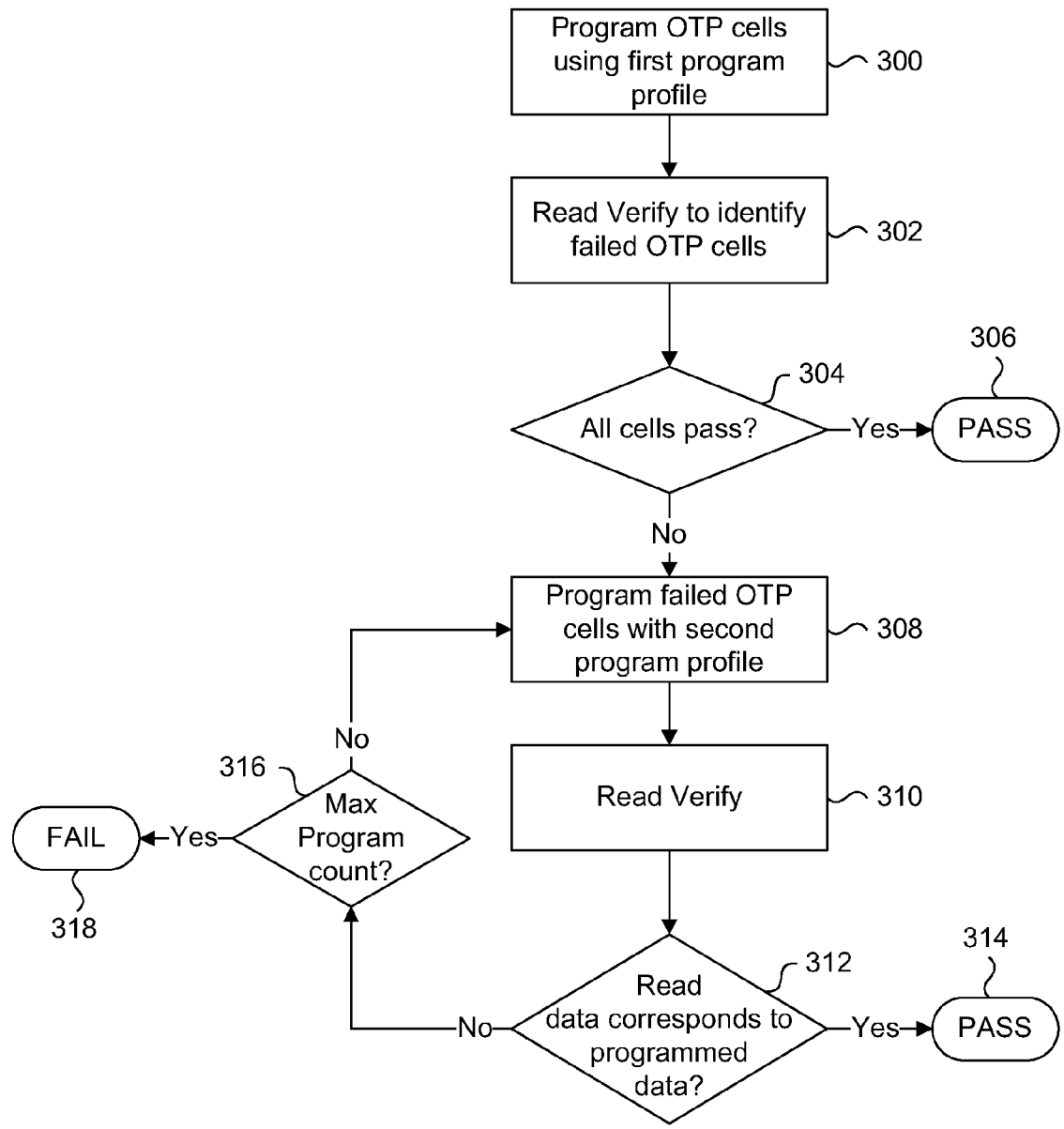
FIG. 9 is a flow chart showing an alternate programming method, according to a present embodiment.

FIG. 9 is a flow chart illustrating an alternate programming operation using the same steps as shown in the flow chart of FIG. 8, according to a present embodiment. Accordingly, the same reference numbers of FIG. 8 are used in FIG. 9 as the same steps are followed. In the alternate embodiment of FIG. 9 the method loops back from step 312 to step 308, as opposed to looping back to step 302 in the embodiment of FIG. 8. Therefore the current method omits the read verify step 302 to shorten the overall time required for the programming operation.

The programming operations of FIG. 8 or 9 are executed for each word to be programmed until the maximum number of iterations is reached, where a word includes bits of data to be programmed to the anti-fuse memory cells connected to one wordline. The method of FIG. 8 has the advantage of identifying weakly programmed cells by inhibiting strongly programmed cells from further programming. Such weakly programmed cells are subjected to reprogramming under different programming parameters to ensure that they are properly programmed. The novel programming scheme combined with the high reliability modes of operation can further reduce erroneous reads, especially when the memory is operating under non-ideal temperature and voltage conditions. Alternatively, a simplified programming operation that does not identify weakly programmed cells could be used to shorten the programming time per word. In such a situation, the high reliability modes of operation will compensate for any programming deficiencies by reading out the data with high reliability. The method of FIG. 9 compromises by executing only one iteration of identifying weakly programmed cells to shorten the programming time per word.

The presently described programming method can be used to improve manufacturing yield if other post fabrication testing indicates that potentially defective cells are present. In such a case, the manufacturer can instruct end users that a one of the high reliability read modes should be used for the memory device. Alternately, the manufacturer can hardwire the read mode of the memory device with any suitable means.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A method for programming one time programmable (OTP) memory cells comprising:
   programming input data with first programming parameters;
   identifying bits of the input data which failed programming with the first programming parameters as failed bits by read verifying programmed data programmed with the first programming parameters by driving a selected wordline with a first read voltage;
   reprogramming the failed bits with second programming parameters different from the first programming parameters; and,
   repeating identifying if at least one bit is identified as failing the reprogramming by read verifying the reprogrammed data reprogrammed with the second programming parameters by driving the selected wordline with a second read voltage.

2. The method of claim 1, wherein identifying includes inhibiting bits of the input data which passed programming from further programming.

3. The method of claim 1, wherein the first programming parameters include a first programming voltage level and a first duration of time, and programming includes driving a selected wordline with the first programming voltage level for the first duration of time.

4. The method of claim 3, wherein the second programming parameters include a second programming voltage level and a second duration of time, and reprogramming includes driving the selected wordline with the second programming voltage level for the second duration of time.

5. The method of claim 4, wherein the first programming voltage level and the second programming voltage level are the same.

6. The method of claim 4, wherein the first programming voltage level is less than the second programming voltage level.

7. The method of claim 4, wherein the first duration of time is less than the second duration of time.

8. The method of claim 1, wherein the first read voltage is less than the second read voltage.

9. The method of claim 8, wherein the second read voltage is the same or lower than a read voltage used during normal read operations.

10. The method of claim 1, wherein a read operation is executed after all bits of the input data have been successfully programmed by selecting at least four memory cells concurrently in a differential-redundant read mode to read one bit of data from every four OTP memory cells.

11. The method of claim 10, wherein selecting includes driving at least four wordlines concurrently with a third read voltage for accessing the at least four memory cells, the third read voltage being lower than the second read voltage.

12. The method of claim 10, wherein selecting includes driving at least four wordlines concurrently for accessing the at least four memory cells connected to different bitlines, and operating a sense amplifier to compare levels corresponding to combinations of the different bitlines to each other.

13. The method of claim 10, wherein selecting includes driving one wordline for accessing the at least four memory cells connected to different bitlines, and operating a sense amplifier to compare levels of the different bitlines to each other.

14. The method of claim 1, wherein repeating further includes comparing the reprogrammed data to the input data, the at least one bit being identified as failing the reprogramming if at least one bit of the reprogrammed data fails to correspond with at least one bit of the input data.

15. The method of claim 1, wherein a read operation is executed after all bits of the input data have been successfully programmed by selecting at least two memory cells concurrently in one of a redundant read mode and a differential read mode to read one bit of data from every two OTP memory cells.

16. The method of claim 15 wherein selecting includes driving at least two wordlines concurrently with a third read voltage for accessing the at least two memory cells, the third read voltage being lower than the second read voltage.

17. The method of claim 15, wherein selecting includes driving at least two wordlines concurrently for accessing the at least two memory cells connected to one bitline, and operating a sense amplifier to compare a bitline level corresponding to the one bitline to a reference level.

18. The method of claim 15, wherein selecting includes driving at least two wordlines concurrently for accessing the at least two memory cells connected to different bitlines, and operating a sense amplifier to compare bitline levels corresponding to the different bitlines to each other.

19. The method of claim 15, wherein selecting includes driving one wordline for accessing the at least two memory cells connected to different bitlines.

20. The method of claim 19, wherein selecting includes coupling the different bitlines to complementary inputs of a sense amplifier, and operating the sense amplifier to compare levels of the different bitlines to each other.

21. The method of claim 19, wherein selecting includes coupling the different bitlines to one input of a sense amplifier, and operating the sense amplifier to compare a level corresponding to a combination of the different bitlines to a reference level.

22. The method of claim 21, wherein the level and the reference level is a voltage.

23. The method of claim 21, wherein the level and the reference level is a current.

24. A one time programmable memory system, comprising:
  a memory array having one time programmable (OTP) cells connected to bitlines and wordlines;
  a select circuit configurable to couple a variable number of OTP cells to a sense amplifier at the same time in response to an address and a selected read mode of operation;
  a mode selector for selecting the read mode of operation to control the select circuit to access one OTP cell per bit of data in a single-ended mode during a program or verify operation, and to control the select circuit to concurrently access at least two OTP cells per bit of data for sensing during a read operation; and
  a voltage circuit for providing a programming voltage during initial programming of the OTP cells, the voltage circuit providing a first read voltage during a first read verify operation and a second read voltage during a second read verify operation.

25. The one time programmable memory system of claim 24, further including control logic for configuring the mode selector to operate in the single-ended mode during the program operation, the control logic executing a programming operation.

26. The one time programmable memory system of claim 24, wherein the select circuit includes configurable row circuits and the memory array includes
  a first wordline connected to a first OTP cell,
  a second wordline connected to a second OTP cell,
  a third wordline connected to a third OTP cell,
  a fourth wordline connected to a fourth OTP cell,
  a first bitline connected to the first OTP cell and the third OTP cell,
  a second bitline connected to the second OTP cell and the fourth OTP cell, and
  a sense amplifier for sensing a difference between the first bitline level and the second bitline level.

27. The one time programmable memory system of claim 26, wherein the configurable row circuits concurrently drive one pair of wordlines including the first wordline and the third wordline or the second wordline and the fourth wordline in a redundant read mode.

28. The one time programmable memory system of claim 26, wherein the configurable row circuits concurrently drive one pair of wordlines including the first wordline and the second wordline or the third wordline and the fourth wordline in a differential read mode.

29. The one time programmable memory system of claim 26, wherein the configurable row circuits concurrently drive the first wordline, the second wordline, the third wordline and the fourth wordline in a differential-redundant read mode.

30. The one time programmable memory system of claim 24, wherein the select circuit includes configurable column circuits and the memory array includes
  a first bitline connected to a first OTP cell,
  a second bitline connected to a second OTP cell,
  a third bitline connected to a third OTP cell,
  a fourth bitline connected to a fourth OTP cell,
  a first sense line selectively coupled to the first and second bitline,
  a second sense line selectively coupled to the third and forth bitline, and
  a sense amplifier for sensing a difference between the first sense line level and the second sense line level.

31. The one time programmable memory system of claim 30, wherein the configurable column circuits concurrently couple one pair of bitlines including the first bitline and the second bitline to the first sense line, or the third bitline and the fourth bitline to the second sense line in a redundant read mode.

32. The one time programmable memory system of claim 30, wherein the configurable column circuits concurrently couple one pair of bitlines including the first bitline and the third bitline to the first sense line and the second sense line respectively, or the second bitline and the fourth bitline to the second sense line respectively, in a differential read mode.

33. The one time programmable memory system of claim 30, wherein the configurable column circuits concurrently couple the first bitline and the second bitline to the first sense line, and the third bitline and the fourth bitline to the second sense line in a differential-redundant read mode.

* * * * *